United States Patent
Wells et al.

(10) Patent No.: US 11,370,374 B2
(45) Date of Patent: Jun. 28, 2022

(54) SCHEDULE-BASED POWER MANAGEMENT SYSTEM

(71) Applicant: TOYOTA MOTOR NORTH AMERICA, INC., Plano, TX (US)

(72) Inventors: Andrew L. Wells, Denton, TX (US); Eric Randell Schmidt, Northville, MI (US)

(73) Assignee: TOYOTA MOTOR NORTH AMERICA, INC., Plano, TX (US)

( * ) Notice: Subject to any disclaimer, the term of this patent is extended or adjusted under 35 U.S.C. 154(b) by 28 days.

(21) Appl. No.: 16/181,804

(22) Filed: Nov. 6, 2018

(65) Prior Publication Data

US 2020/0139908 A1    May 7, 2020

(51) Int. Cl.
*B60R 16/033* (2006.01)
*H02J 7/00* (2006.01)
*G01R 31/382* (2019.01)
*B60R 16/037* (2006.01)

(52) U.S. Cl.
CPC .......... *B60R 16/033* (2013.01); *H02J 7/0063* (2013.01); *B60R 16/037* (2013.01); *G01R 31/382* (2019.01)

(58) Field of Classification Search
CPC ..... B60R 16/033; B60R 16/037; H02J 7/0063
USPC .................................................. 307/38, 10.1
See application file for complete search history.

(56) References Cited

U.S. PATENT DOCUMENTS

| | | | |
|---|---|---|---|
| 8,749,091 B2* | 6/2014 | Skarani | B60L 1/006 307/10.1 |
| 9,390,569 B2 | 7/2016 | Kurnik et al. | |
| 9,739,624 B2 | 8/2017 | Rajagopalan et al. | |
| 2002/0046285 A1* | 4/2002 | Yasushi | H04L 67/306 709/228 |
| 2008/0278345 A1* | 11/2008 | Van Bosch | H04B 7/18517 340/870.07 |
| 2014/0133374 A1* | 5/2014 | Frye | H04W 52/0251 370/311 |
| 2017/0028949 A1 | 2/2017 | Nelson et al. | |
| 2017/0197568 A1 | 7/2017 | DeCia et al. | |
| 2019/0225034 A1* | 7/2019 | Van Wiemeersch | B60C 23/0471 |
| 2019/0326772 A1* | 10/2019 | Shields | B60L 50/50 |

FOREIGN PATENT DOCUMENTS

| CN | 105848257 A | 8/2016 |
|---|---|---|
| DE | 102016014328 A1 | 7/2017 |

* cited by examiner

*Primary Examiner* — Michael R. Fin
(74) *Attorney, Agent, or Firm* — Haynes and Boone, LLP

(57) ABSTRACT

Methods and systems for managing a supply of power to a communications system in a vehicle. A power management system obtains at least one of schedule information for a party associated with the vehicle or historical data for the communications system is obtained. The power management system controls the supply of power from a power source to the communication system when the vehicle is turned off based on the at least one of the schedule information or the historical data.

18 Claims, 4 Drawing Sheets

SCHEDULE-BASED POWER MANAGEMENT SYSTEM

FIELD

The present disclosure generally relates to managing a supply of power in a vehicle and, more particularly, to methods and systems for managing a supply of power to a communications system in a vehicle based on schedule information for a party associated with the vehicle.

BACKGROUND

Some vehicles have communications systems that allow these vehicles to receive information from external sources. For example, a vehicle may have a data communication module that allows the vehicle to wirelessly communicate with a mobile device (e.g., smartphone, tablet, etc.) of a driver, a passenger, an owner of the vehicle, or some other person. The data communication module may also allow the vehicle to communicate with a server, the Internet, or a number of other sources. In some cases, it may be desirable to have a data communication module active when a vehicle is turned off to allow information to be transmitted to or received from the vehicle even when the vehicle is turned off. However, some currently available data communication modules are not operable for long periods of time due to less than desirable power management.

SUMMARY

In one example embodiment, a method implemented by a power management system in a vehicle is provided for managing a supply of power to a communications system in the vehicle. The power management system obtains schedule information for a party associated with the vehicle. The power management system controls the supply of power from a power source to the communication system when the vehicle is turned off based on the schedule information.

In another example embodiment, a method implemented by a power management system in a vehicle is provided for managing a supply of power to a communications system in the vehicle. The power management system obtains at least one of schedule information for a party associated with the vehicle or historical data for the communications system. The power management system determines a status of a power source that supplies power to the communications system. The power management system updates a power program based on the status of the power source and the at least one of the schedule information or the historical data. The power management system controls the supply of power from the power source to the communication system when the vehicle is turned off based on the power program.

In yet another example embodiment, a system for managing a supply of power to a communications system in a vehicle is provided. The system includes a power source and a power management system. The power source is used to power to a communications system in the vehicle. The power management system is used to obtain schedule information for a party associated with the vehicle and to control the supply of power from the power source to the communication system when the vehicle is turned off based on the schedule information.

It is to be understood that both the foregoing general description and the following detailed description are exemplary and explanatory in nature and are intended to provide an understanding of the present disclosure without limiting the scope of the present disclosure. In that regard, additional aspects, features, and advantages of the present disclosure will be apparent to one skilled in the art from the following detailed description.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals, letters, or both in the various examples. This repetition is for the purpose of simplicity and clarity and does not in itself dictate a relationship between the various embodiments and/or configurations discussed.

DETAILED DESCRIPTION

Figure 1:
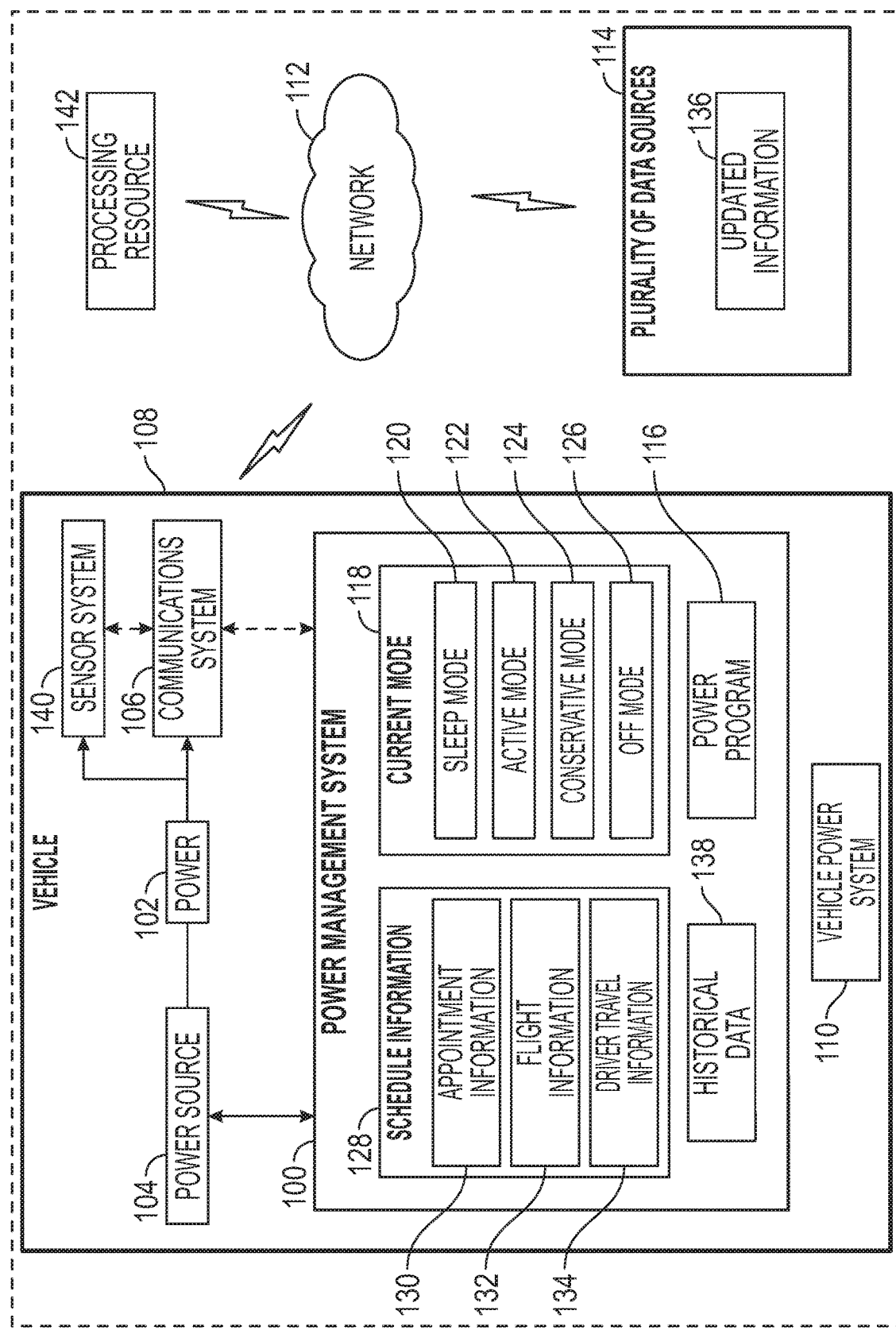
FIG. 1 is a block diagram depicting a power management system in accordance with an example embodiment.

Illustrative embodiments and related methods of the present disclosure are described below as they might be employed in one or more methods and systems for managing a supply of power to a communications system in a vehicle. In the interest of clarity, not all features of an actual implementation or method are described in this specification. It will of course be appreciated that in the development of any such actual embodiment, numerous implementation specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure. Further aspects and advantages of the various embodiments and related methods of the disclosure will become apparent from consideration of the following description and drawings.

The example embodiments described below recognize that it may be desirable to have methods and systems for allowing the communications system of a vehicle to establish communications over a network without unnecessarily draining the power source of that communications system, too quickly draining the power source of the communications system, or both. Thus, as described herein, methods and systems of the present disclosure use schedule information for a party associated with a vehicle, historical data for a communications system of the vehicle, historical data for a power source of the communications system, or a combination thereof to manage the supply of power to the communications system when the vehicle is turned off. A party associated with a vehicle may be, for example, a driver of the vehicle, a passenger of the vehicle, an owner of the vehicle, a rental car agent, a rental car agency, a car service company, or some other type of person or entity.

In one or more example embodiments, a power management system is used to obtain schedule information for a party associated with the vehicle. The schedule information is used to update a power program that controls operation of a power source for supplying power to the communications system when the vehicle is turned off. The power management system controls the supply of power from the power source to the communication system when the vehicle is turned off based on the updated power program. The power management system provides a fast, easy, and efficient way of allowing the vehicle (i.e., one or more systems in the vehicle) to exchange data with other systems and devices remote to the vehicle even when the vehicle is turned off. Using a power program that is updated based on the schedule information of the party associated with the vehicle ensures not only that the power source to the communications system is effectively operated such that the charge level or charge capacity of the power source is not unnecessarily or too quickly drained, but also that the activity of the communications system is customized for the needs of the party associated with the vehicle.

Referring now to the figures, FIG. 1 is a block diagram depicting a power management system 100 in accordance with an example embodiment. Power management system 100 is used to manage the supply of power 102 from power source 104 to communications system 106 in vehicle 108.

In this illustrative example, vehicle 108 may be, for example, a car, a truck, an SUV, or some other type of vehicle. Vehicle 108 includes vehicle power system 110. Vehicle power system 110 may include at least one of a battery (e.g., a rechargeable battery), a fueled propulsion system, a solar power system, an electricity storage system, or some other component, device, or system for powering vehicle 108. In one or more examples, power source 104 is integrated as part of vehicle power system 110. In some examples, power source 104 is separate from and independent of vehicle power system 110. In other examples, power source 104 may be partially integrated as part of vehicle power system 110.

Power source 104 may include any type of source capable of supplying power 102 to communications system 106. As one example, power source 104 may include at least one battery. The battery may be a rechargeable battery. For example, the battery may be recharged every time that vehicle 108 is turned on. In other examples, power source 104 includes an electricity generator, an electricity storage system, or both.

Communications system 106 allows vehicle 108 to communicate with other devices and systems over network 112. Communications system 106 may include any number of components for providing communications over network 112. Network 112 may include any number of communications networks of any number of types and in any number of different configurations. For example, network 112 may include at least one of a local area network (WAN), a wide area network (WAN) (e.g., the Internet), a public network, a private network, a peer-to-peer network, a cellular network, an ad hoc network, some other type of radio communications network, or some other type of communications network. In one illustrative example, communications system 106 takes the form of a data communication module (DCM).

In one or more examples, communications system 106 allows vehicle 108 to communicate with at least one of plurality of data sources 114. Plurality of data sources 114 may include any number of sources of data. For example, plurality of data sources 114 may include a server, a mobile device, a database, the Internet, a mobile device application, a gaming console, an online weather service, an online traffic service, some other source accessible via network 112, or a combination thereof. A server may include at least one of a physical server, a virtual server, a web, server or some other type of server. In some examples, a server includes one or more physical servers and one or more virtual servers in communication with each other.

Power management system 100 controls the supply of power 102 to communications system 106 when vehicle 108 is turned off. Power management system 100 is implemented using software, hardware, firmware, or a combination thereof. In some examples, power management system 100 is implemented using a single processor or multiple processors in communication with each other. When multiple processors are used, these processors may be in communication with each other through at least one of a wired communications link, a wireless communications link, or some other type of communications link. In some examples, power management system 100 includes various components that are in communication with each other through at least one of wired, wireless, or optical communications links.

In one or more examples, power management system 100 is implemented partially or fully as part of communications system 106. In other examples, power management system 100 is implemented partially or fully implemented as part of power source 104. In this manner, power management system 100 may be implemented within any one of or combination of communications system 106 and power source 104. When power management system 100 is implemented partially or fully as part of communications system 106, power source 104, or both, power source 104 also supplies power 102 to power management system 100.

In other examples, power management system 100 is implemented within vehicle 108, separate and independent from communications system 106. In still other examples, power management system 100 is implemented remotely with respect to vehicle 108. For example, power management system 100 may be implemented using a remote server.

Power management system 100 controls the supply of power 102 from power source 104 to communications system 106 when vehicle 108 is turned off. In one or more examples, power 102 supplied to power source 104 is controlled by power program 116. Power program 116 may be stored in a database, a spreadsheet, a document, or some other data structure. In one or more examples, power program 116 is stored in a database within power management system 100. In other examples, power program 116 is stored in a data store in communications system 106.

In one example embodiment, power program 116 determines the amount (or level) of power 102 supplied to power source 104 at any given point in time. For example, power program 116 may identify modes of operation for power source 104 to be used in general, as well as modes of operation for power source 104 to be used at specific dates and times. For example, power source 104 may have current mode 118 of operation. In these examples, at any given point in time, current mode 118 is selected from one of at least two modes of operation. For example, current mode 118 may be selected from either sleep mode 120 or active mode 122. In other examples, current mode 118 may be selected from one of sleep mode 120, active mode 122, conservative mode 124, or some other mode.

Sleep mode 120 is a mode in which a relatively low amount of power 102 is supplied from power source 104 to power management system 100, to communications system 106, or both, depending on the implementation of these two systems. This relatively low amount of power 102 is an amount sufficient for power source 104 to be operated based on power program 116, even when vehicle 108 is turned off. As one illustrative example, in sleep mode 120, power source 104 provides a low amount of power 102 to power management system 100 but an amount that is sufficient to enable power management system 100 to control power source 104 based on power program 116. In other examples, in sleep mode 120, power source 104 provides power 102 to communications system 106 so that communications system 106 can control the supply of power 102 to communications system 106 based on power program 116 provided by power management system 100. In these examples, when power source 104 is in sleep mode 120, communications system 106 does not receive sufficient power 102 for communications over network 112. In some cases, sleep mode 120 may be also referred to as a low power mode or a hibernation mode.

Active mode 122 is a mode in which a higher amount of power 102, relative to sleep mode 120, is supplied from power source 104 to communications system 106. In active mode 122, power source 104 provides sufficient power 102 to communications system 106 to enable communications system 106 to communicate with at least one of plurality of data sources 114 over network 112. In some cases, active mode 122 may also be referred to as a high power mode, an awake mode, an "on" mode, or a fast transfer mode.

As described above, in some cases, current mode 118 may be conservative mode 124. In conservative mode, the amount of power 102 delivered by power source 104 is between the amount of power 102 delivered in sleep mode 120 and the amount of power 102 delivered in active mode 122. Conservative mode 124 is used to conserve the charge level or charge capacity of power source 104 but still allow for communications. For example, when power source 104 is a battery, conservative mode 124 may be used to supply power 102 to communications system 106 when the battery has a charge level that is lower than some threshold level. The amount of power 102 supplied to communications system 106 is sufficiently low so as to not deplete the charge of the battery too quickly but is sufficiently high to enable communications system 106 to establish communications over network 112. With conservative mode 124, the speed at which data is transferred over network 112 to and from communications system 106 is slower than the speed of data transfer for active mode 122. In some cases, conservative mode 124 is referred to as a medium power mode or a slow transfer mode.

In still other examples, current mode 118 may be off mode 126. In these examples, power source 104 enters off mode 126 when vehicle 108 is turned on or at the lapse of a selected time period after vehicle 108 has been turned on. Further, in some cases, when current mode 118 is in off mode 126 and vehicle 108 is turned on, communications system 106 is powered by vehicle power system 110.

Power management system 100 uses schedule information 128 to update power program 116 to control the supply of power 102 to communications system 106. In one or more examples, schedule information 128 is for a party associated with vehicle 108. In these illustrative examples, a party associated with vehicle 108 may be a driver, a passenger, or an owner of vehicle 108 or some other person associated with the vehicle (e.g., a rental car agent, a car service agent, etc.). In other illustrative examples, the party may be an entity such as, for example, a rental car agency, a car service company, a shared ride service company, an organizational group, a school, or some other type of entity. In the example embodiments described below, references to the driver of a vehicle, such as vehicle 108 may be considered as also being applicable to any of these other types of parties associated with vehicle 108.

In some examples, schedule information 128 includes schedule information for more than one driver of vehicle 108. Power management system 100 may receive schedule information 128 directly or indirectly. In these illustrative examples, power management system 100 obtains schedule information 128 from at least one of a remote server, a database, a mobile device of a driver of vehicle 108, the Internet, or some other source. In some cases, power management system 100 receives at least a portion of schedule information 128 from communications system 106, which obtains schedule information 128 from at least one of a remote server, a database, a mobile device of a driver of vehicle 108, the Internet, or some other source.

In one or more examples, schedule information 128 includes at least one of appointment information 130, flight information 132, driver travel information 134, or some other type of schedule information for one or more drivers of vehicle 108. Appointment information 130 includes information about one or more different types of appointments of a driver. These appointments may include, for example, but are not limited to, medical appointments, gym appointments, school appointments, work appointments, or a combination thereof. Further, an appointment may be a one-time appointment or a recurring appointment. The information for an appointment may include, but is not limited to, a start time, an end time, a date, a day of recurrence, a month of recurrence, or a combination thereof.

Power management system 100 uses appointment information 130 to determine when and how often to switch current mode 118 to a different mode. Power management system 100 updates power program 116 accordingly. For example, power management system 100 may determine that if current mode 118 is sleep mode 120, sleep mode 120 should be switched to active mode 122 or conservative mode 124 two hours before a medical appointment. Power management system 100 updates power program to reflect this timing. Switching power source 104 to active mode 122 increases the supply of power 102 to communications system 106. In other words, switching power source 104 to active mode 122 "wakes up" communications system 106 and allows communications system 106 receive or retrieve updated information 136 over network 112. For example, communications system 106 may connect to one or more of plurality of data sources 114 to obtain updated information 136.

In some cases, updated information 136 will include new information about the medical appointment (e.g., a navigation route for reaching the medical office, an updated appointment time, instructions for the medical appointment provided by the medical provider, etc.). In one example, at least a portion of updated information 136 is presented to the driver of vehicle 108 when vehicle 108 is turned on. As one illustrative example, upon authenticating the driver (e.g., using facial recognition technology, voice recognition technology, fingerprint technology, other types of biometric technology, etc.), vehicle 108 automatically enters a navigation route for reaching the medical office into the navigation system of vehicle 108. The navigation route may be displayed to the driver in a display device in vehicle 108 (e.g., head unit, head-up display, etc.).

In still other examples, updated information 136 includes various other types of information. Updated information 136 may include, for example, weather data, traffic data, vehicle software updates, calendar updates, map updates, fuel prices updates, or a combination thereof.

Flight information 132 includes information about flights (e.g., upcoming flights, past flights, etc.) booked by a driver. This information may include, for example, a scheduled arrival time, a scheduled departure time, a flight status, a delayed arrival time, a delayed departure time, or a combination thereof. Power management system 100 uses flight information 132 to determine when and how often to switch current mode 118 to some other mode.

In one illustrative example, power management system 100 uses flight information 132 to determine that the driver of vehicle 108 has a roundtrip flight and will be out of town for two weeks. Power management system 100 may also use position information (e.g., GPS information) from a positioning system of vehicle 108, a mobile device of the driver, or both to determine that the driver is leaving vehicle 108 in an airport parking lot for the duration of the trip. Accordingly, power management system 100 updates power program 116 to cause sleep mode 120 to be switched to active mode 122 or conservative mode 124 at regular 12-hour intervals during the two-week trip and again 3 hours before the scheduled arrival time.

While in active mode 122 or conservative mode 124, communications system 106 allows communications over network 112 to obtain updated information 136. This updated information 136 may include, for example, a new arrival time and arrival gate information. This information is used to further update power program 116 as needed. In some cases, updated information 136 includes other information that is sent to one or more systems in vehicle 108, information that is stored in a database or other data structure of future use or processing, or both.

Driver travel information 134 includes information about the use of vehicle 108 by the driver. For example, driver travel information 134 may include, but is not limited to, dates and times at which vehicle 108 is turned on, dates and times at which vehicle 108 is turned off, driving route information, dates and times associated with certain driving routes, or a combination thereof. Power management system 100 uses driver travel information 134 to determine when and how often to switch current mode 118 to active mode 122 or conservative mode 124.

In one illustrative example, power management system 100 uses driver travel information 134 to determine that the driver has driven vehicle 108 from a home location to a work location, weekdays at around 8:00 a.m. for nearly 20 consecutive weekdays. Power management system 100 updates power program 116 to ensure that sleep mode 120 is switched to active mode 122 or conservative mode 124 at about 7:50 a.m. every weekday. This switch allows communications system 106 to establish communications over network 112 to obtain updated information 136. For example, communications system 106 may connect to a mobile device application that provides a prediction of the type of music that the driver is currently in the mood to hear. When vehicle 108 is turned on, this updated information 136 is used to automatically set the music playlist for the driver's trip to the work location.

In other illustrative examples, when schedule information 128 is for a party associated with vehicle 108 other than a driver, driver travel information 134 may take the form of some other type of travel information. For example, driver travel information 134 may be passenger travel information, owner travel information, travel information corresponding to an agent of an entity or an entity, or some other type of travel information.

In some illustrative examples, power management system 100 also uses historical data 138 to control the supply of power 102 to communications system 106. Historical data 138 includes information about the history of operation of power source 104, communications system 106, or both. In one or more examples, historical data 138 includes information tracking current mode 118 of operation for power source 104 over a selected period of time. For example, historical data 138 may track every time power source 104 switches modes for the trailing 15 days, one month, three months, six months, or twelve months with respect to a current time. In some cases, when vehicle 108 is used by multiple drivers, historical data 138 tracks this information individually for the different drivers.

Power management system 100 may also use power program 116 to control the supply of power 102 to sensor system 140 in vehicle 108 in some examples. Sensor system 140 may include at least one of an image sensor, a temperature sensor, a position sensor, a rain gauge, a fuel level sensor, a tire pressure sensor, or some other type of sensor. Power management system 100 may use power program 116 to determine when and how to supply power 102 to one or more of the sensors of sensor system 140.

In one illustrative example, power management system 100 uses power program 116 to put power source 104 into active mode 122, conservative mode 124, or one of a set of sensor modes designated for sensor system 140. Each sensor mode of this set of sensor modes may indicate that a predetermined amount of power 102 is to be supplied to communications system 106 and a predetermined amount of power is to be supplied to a corresponding one or more sensors of sensor system 140.

In one or more examples, communications system 106 allows communications over network 112 such that the sensor data generated by sensor system 140 can be transmitted to one or more other systems remote to vehicle 108. For example, the sensor data may be transmitted over network 112 to processing resource 142. In this example, processing resource 142 takes the form of a mobile device application, a web application, an Internet site, a server, a cloud, a processor, some other type of processing system, or a combination thereof. In some cases, processing resource 142 may process the sensor data to generate updated information that is sent back to vehicle 108 over network 112.

In this manner, power management system 100 efficiently manages the supply of power 102 to communications system 106 such that information may be transmitted from and received at vehicle 108 even when vehicle 108 is turned off. Power management system 100 ensures that power source 104 for communications system 106 is not unnecessarily drained or too quickly drained.

Figure 2:
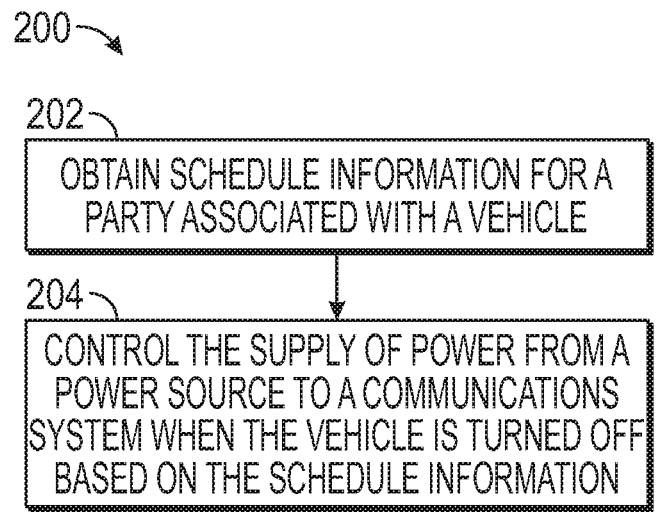
FIG. 2 is a flowchart of a method for managing a supply of power to a communications system in a vehicle in accordance with an example embodiment.

FIG. 2 is a flowchart of a method 200 for managing a supply of power to a communications system in a vehicle in accordance with an example embodiment. Method 200 is illustrated as a set of operations or steps 202 and 204 and is described with continuing reference to FIG. 1. One or more steps that are not expressly illustrated in FIG. 2 may be included before, after, in between, or as part of the steps 202 and 204. In some embodiments, one or more of the steps 202 and 204 may be implemented, at least in part, in the form of executable code stored on non-transitory, tangible, machine-readable media that when run by one or more processors may cause the one or more processors to perform one or more of the processes. In one or more embodiments, the steps 202 and 204 may be performed by power management system 100 from FIG. 1.

Method 200 may begin by power management system 100 obtaining schedule information 128 for a party associated with vehicle 108 (step 202). As previously described, the party may be a driver, a passenger, an owner of vehicle 108, an agent, or some other type of person or entity. Power management system 100 controls the supply of power 102 from power source 104 to the communications system 106 when the vehicle 108 is turned off based on the schedule information 128 (step 204).

As previously discussed, schedule information 128 may include, for example, appointment information, flight information, driver travel information, other types of schedule information, or a combination thereof. Schedule information 128 used by power management system 100 may include information obtained via communications established by communications system 106 prior to vehicle 108 being turned off. In some cases, schedule information 128 includes at least a portion of updated information 136 obtained via communications over network 112 while vehicle 108 is turned off (e.g., while power source 104 is in active mode 122 or conservative mode 124). In one or more examples, schedule information 128 includes information obtained over network 112 from one or more of plurality of data sources 114.

At step 204, power management system 100 controls the supply of power 102 to power source 104 to communications system 106 when vehicle 108 is turned off by determining when and for how long power 102 is supplied to communications system 106. Power management system 100 ensures that sufficient power is delivered to communications system 106 to establish communications over network 112 as needed based on the schedule information. In some illustrative examples, power management system 100 controls when power source 104 is switched from sleep mode 120 to active mode 122, which causes power source 104 to deliver an increased supply of power 102 to communications system 106.

Figure 3:
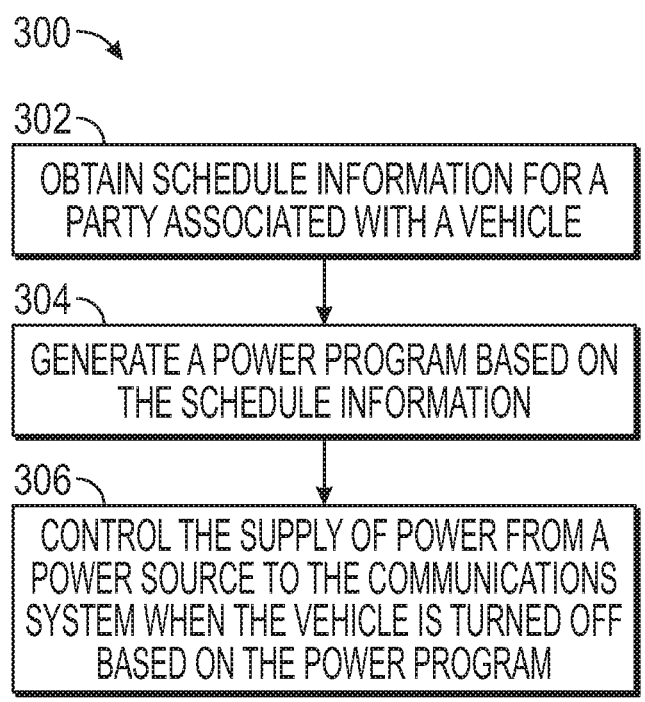
FIG. 3 is another flowchart of a method for managing a supply of power to a communications system in a vehicle in accordance with an example embodiment.

FIG. 3 is a flowchart of a method 300 for managing a supply of power to a communications system in a vehicle in accordance with an example embodiment. Method 300 is illustrated as a set of operations or steps 302 through 306 and is described with continuing reference to FIG. 1. Not all of the illustrated steps 302 through 306 may be performed in all embodiments of method 300. One or more steps that are not expressly illustrated in FIG. 3 may be included before, after, in between, or as part of the steps 302 through 306. In some embodiments, one or more of the steps 302 through 306 may be implemented, at least in part, in the form of executable code stored on non-transitory, tangible, machine-readable media that when run by one or more processors may cause the one or more processors to perform one or more of the processes. In one or more embodiments, the steps 302 through 306 may be performed by power management system 100 from FIG. 1.

Method 300 begins by power management system 100 obtaining schedule information 128 for a party associated with vehicle 108 (step 302). Step 302 may be implemented in a manner similar to step 202 of method 200 in FIG. 2. In some illustrative examples, at step 302, power management system 100 also obtains historical data 138. Historical data 138 may provide information about the history of operation of power source 104, communications system 106, or both.

Power management system 100 generates power program 116 based on schedule information 128 (step 304). Step 304 may be performed in a number of different ways. In one illustrative example, power management system 100 uses schedule information 128 to make one or more predictions about when communications system 106 should be awakened. At step 304, power management system 100 uses the one or more predictions to generate power program 116. In other illustrative examples, step 304 includes replacing a portion of, adding a portion to, or removing a portion from an existing template power program.

Power management system 100 controls the supply of power 102 from power source 104 to the communications system 106 when the vehicle 108 is turned off based on power program 116 (step 306). Power program 116 may identify, for example, at least one date and time at which power source 104 is to switch from sleep mode 120 to active mode 122 to thereby provide a higher amount of power 102 to communications system 106 while vehicle 108 is turned off. In some illustrative examples, power program 116 identifies a periodic event or other event that will dictate when the supply of power 102 to communications system 106 is to be increased. For example, power program 116 may specify that power source 104 is to be switched from sleep mode 120 to active mode 122 every 10 hours, with active mode 122 being "on" for a period of 20 minutes before power source 104 is switched back to sleep mode 120.

Figure 4:
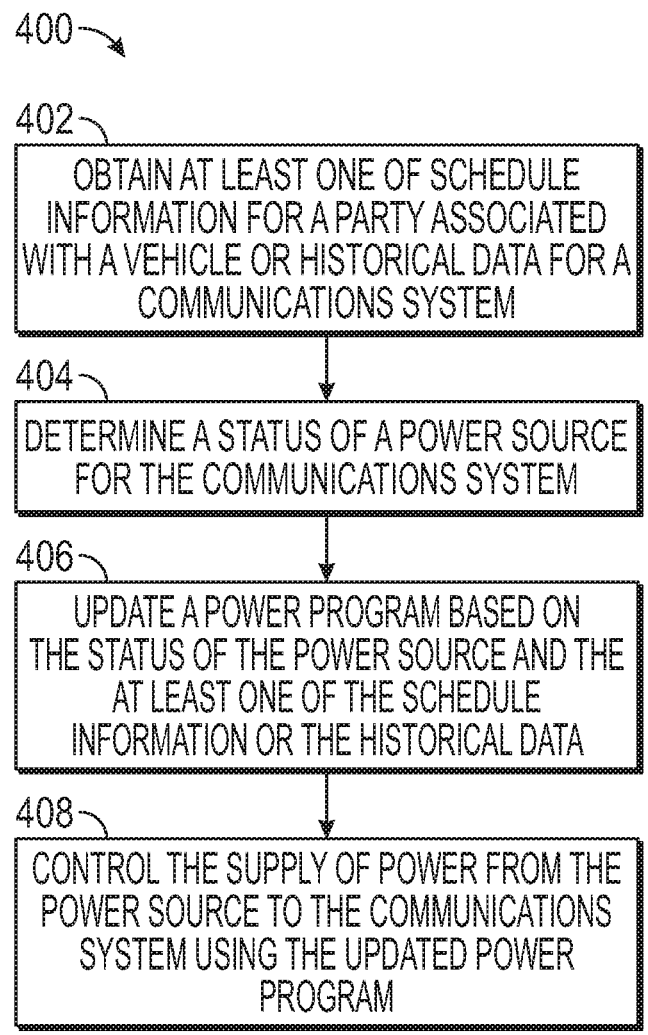
FIG. 4 is another flowchart of a method for managing a supply of power to a communications system in a vehicle in accordance with an example embodiment.

FIG. 4 is a flowchart of a method 400 for managing a supply of power to a communications system in a vehicle in accordance with an example embodiment. Method 400 is illustrated as a set of operations or steps 402 through 408 and is described with continuing reference to FIG. 1. Not all of the illustrated steps 402 through 408 may be performed in all embodiments of method 400. One or more steps that are not expressly illustrated in FIG. 4 may be included before, after, in between, or as part of the steps 402 through 408. In some embodiments, one or more of the steps 402 through 408 may be implemented, at least in part, in the form of executable code stored on non-transitory, tangible, machine-readable media that when run by one or more processors may cause the one or more processors to perform one or more of the processes. In one or more embodiments, the steps 402 through 408 may be performed by power management system 100 from FIG. 1.

Method 400 begins by power management system 100 obtaining at least one of schedule information 128 for a party associated with vehicle 108 or historical data 138 for communications system 106 (step 402). Power management system 100 then determines a status of power source 104 (step 404). At step 404, the status for power source 104 may be, for example, a charge level or remaining charge capacity of power source 104. In one or more examples, power management system 100 receives the status for power source 104 from a sensor coupled with or integrated as part of power source 104.

Power management system 100 updates power program 116 based on the status of power source 104 and the at least one of the schedule information or the historical data (step 406). Updating power program 116 may include replacing initial or default values in power program 116, adding to power program 116, removing one or more portions of power program 116, replacing one or more portions of power program 116, or otherwise updating power program 116. Thereafter, power management system 100 controls the supply of power 102 from power source 104 to communications system 106 using the updated power program 116 (step 408).

Figure 5:
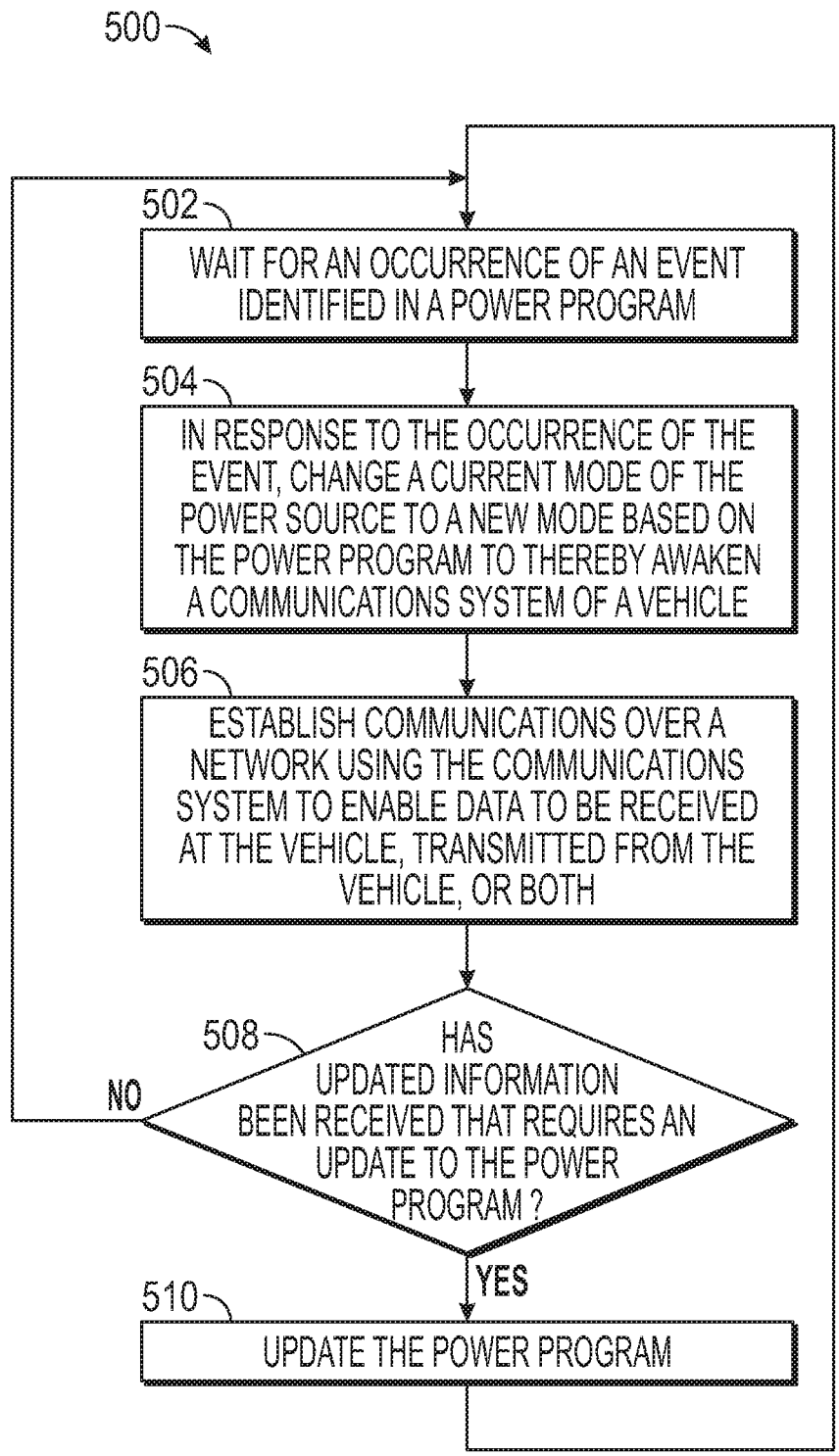
FIG. 5 is another flowchart of a method for managing a supply of power to a communications system in a vehicle in accordance with an example embodiment.

FIG. 5 is a flowchart of a method 500 for managing a supply of power to a communications system in a vehicle in accordance with an example embodiment. Method 500 is illustrated as a set of operations or steps 502 through 506 and is described with continuing reference to FIG. 1. Not all of the illustrated steps 502 through 506 may be performed in all embodiments of method 500. One or more steps that are not expressly illustrated in FIG. 5 may be included before, after, in between, or as part of the steps 502 through 506. In some embodiments, one or more of the steps 502 through 506 may be implemented, at least in part, in the form of executable code stored on non-transitory, tangible, machine-readable media that when run by one or more processors may cause the one or more processors to perform one or more of the processes. In one or more embodiments, the steps 502 through 506 may be performed by power management system 100 from FIG. 1.

Method 500 begins by waiting for an occurrence of an event identified in power program 116 (step 502). At step 502, the event may be a periodic event, such as a lapse of a timer or a predetermined number of hours or days. In response to the occurrence of the event, power management system 100 changes a current mode of power source 104 to a new mode based on power program 116 to thereby awaken communications system 106 of vehicle 108 (step 504). At step 504, the new mode may be active mode 122, conservative mode 124, a sensor mode, or some other type of mode.

Communications system 106 establishes communications over network 112 to enable data to be received at vehicle 108, transmitted from vehicle 108, or both (step 506). At step 506, updated information 136 may be received at vehicle 108. In some examples, this updated information 136 includes an updated synchronization of the driver's email with a vehicle messaging system. In one or more examples, updated information 136 includes traffic data that can be used by vehicle 108 to generate alerts or notifications for automatic presentation to the driver when vehicle 108 is turned on. In yet other examples, communications over network 112 may lead to any number of components or systems in vehicle 108 performing any number of or combination of operations.

Power management system 100 determines whether updated information has been received that requires an update to power program 116 (step 508). If updated information requiring an update to power program 116 has not been received, method 500 returns to step 502 as described above. Otherwise, power management system 100 updates power program 116 (step 510), with method 500 then returning to step 502 using the updated power program 116.

In this manner, the example embodiments described above provide various methods and systems for easily, quickly, and efficiently managing the supply of power to a communications system of a vehicle. The communications system may be awakened at one or more predetermined dates and times while the vehicle is turned off to allow an exchange of information between the vehicle and one or more other data sources or resources. The methods and systems described above provide synchronization of the communications system and the power source for the communications system based on schedule information for one or more parties associated with the vehicle (e.g., drivers, passengers, vehicle owners, rental agencies, ride service companies, etc.), historical data for the communications system, historical data for the power source for the communications system, or a combination thereof. Thus, the schedule-based power management system customizes power management of the communications system based on the needs of the one or more drivers and a history of operation.

While certain exemplary embodiments of the invention have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. The intention is to cover all modifications, equivalents and alternatives falling within the spirit and scope of the disclosure as defined by the claims.

What is claimed is:

1. A method implemented by a power management system in a vehicle for managing a supply of power to a communications system in the vehicle, the method comprising:
    obtaining, by the power management system, schedule information for a party associated with the vehicle; and
    making, by the power management system, a prediction of when to awake the communications system based on the schedule information;
    generating, by the power management system, a power program using the prediction; and
    changing, by the power management system, a first amount of power being supplied from a power source to the communications system to a second amount of power when the vehicle is turned off by using the power program to switch the power source from a sleep mode to a conservative mode while the vehicle remains turned off,
    wherein the first amount of power supplied during the conservative mode is higher than the second amount of power supplied during the sleep mode; and
    wherein the conservative mode conserves a charge level of the power source while also enabling the communications system to establish communications.

2. The method of claim 1, wherein obtaining, by the power management system,
    the schedule information comprises:
    retrieving the schedule information from a remote server prior to the vehicle being turned off.

3. The method of claim 1, wherein obtaining, by the power management system, the schedule information comprises:
    identifying the schedule information from a database in communication with the power management system, wherein the database is stored on the vehicle.

4. The method of claim 1, wherein obtaining, by the power management system, the schedule information comprises:
    retrieving the schedule information from a mobile device of the party prior to the vehicle being turned off.

5. The method of claim 1, wherein controlling, by the power management system, the supply of power comprises:
    increasing the supply of power to the communications system at a predetermined date and time based on the power program to allow the communications system to establish communications over a network when the vehicle is turned off.

6. The method of claim 1, further comprising:
    switching the power source supplying the power to the communications system from the sleep mode to an active mode, wherein a third amount of power supplied during the active mode is higher than the first amount of power supplied during the conservative mode.

7. The method of claim 1, further comprising:
identifying at least one date and time at which the power management system is to awaken the communications system.

8. The method of claim 7, wherein the power source is separate from a vehicle power system.

9. The method of claim 1, wherein the power program identifies at least one time at which the power management system is to awaken the communications system.

10. The method of claim 1, wherein the schedule information includes at least one of appointment information, flight information, or driver travel information.

11. The method of claim 1, further comprising:
obtaining, by the power management system, historical data for the communications system.

12. The method of claim 11, wherein controlling, by the power management system, the supply of power comprises:
controlling the supply of power from the power source to the communication system when the vehicle is turned off based on the power program and the historical data.

13. The method of claim 1, further comprising:
determining, by the power management system, a charge level of the power source; and wherein controlling, by the power management system, the supply of power comprises:
controlling the supply of power from the power source to the communications system based on the schedule information and the charge level of the power source.

14. A system for managing a supply of power in a vehicle, the system comprising:
a communications system in the vehicle;
a power source that is configured to provide power to the communications system in the vehicle and that is independent of a vehicle power system; and
a power management system that is used to obtain schedule information for a party associated the vehicle, to make a prediction of when to awake the communications system based on the schedule information; to generate a power program using the prediction; and to control a first amount of power being supplied from a power source to the communications system to a second amount of power when the vehicle is turned off using the power program to switch the power source from a sleep mode to a conservative mode while the vehicle remains turned off;
wherein the first amount of power supplied during the conservative mode is higher than the second amount of power supplied during the sleep mode; and
wherein the conservative mode conserves a charge level of the power source while also enabling the communications system to establish communications.

15. The system of claim 14, wherein the schedule information is obtained from at least one of a mobile device, a server, or a database that is stored on the vehicle and that is in communication with the power management system.

16. The system of claim 14, wherein the schedule information includes at least one of appointment information, flight information, or driver travel information.

17. The system of claim 14, wherein the power management system uses the schedule information and historical data to update the power program.

18. The system of claim 14, wherein the power management system is further configured to control the supply of power from the power source to the communications system when the vehicle is turned off to switch the power source the sleep mode to an active mode, wherein a third amount of power supplied during the active mode is higher than the first amount of power supplied during the conservative mode.

* * * * *

UNITED STATES PATENT AND TRADEMARK OFFICE
CERTIFICATE OF CORRECTION

PATENT NO.         : 11,370,374 B2
APPLICATION NO.    : 16/181804
DATED              : June 28, 2022
INVENTOR(S)        : Andrew L. Wells and Eric Randell Schmidt It is certified that error appears in the above-identified patent and that said Letters Patent is hereby corrected as shown below:

In the Claims

Claim 1, Column 12, Lines 30-31, change "program to switch the power source from a sleep mode to a conservative mode while the vehicle" to --program to switch the power source from a conservative mode to a sleep mode while the vehicle--

Claim 14, Column 14, Lines 7-8, change "using the power program to switch the power source from a sleep mode to a conservative mode while the" to --using the power program to switch the power source from a conservative mode to a sleep mode while the--

Signed and Sealed this
Twenty-seventh Day of September, 2022

Katherine Kelly Vidal
*Director of the United States Patent and Trademark Office*